(12) United States Patent
Sayre

(10) Patent No.: US 7,452,957 B2
(45) Date of Patent: Nov. 18, 2008

(54) HYDROPHILIC SILICONE ELASTOMERS

(75) Inventor: Curtis Sayre, Atlanta, GA (US)

(73) Assignee: Kimberly-Clark Worldwide, Inc., Neenah, WI (US)

( * ) Notice: Subject to any disclaimer, the term of this patent is extended or adjusted under 35 U.S.C. 154(b) by 227 days.

(21) Appl. No.: 11/217,093

(22) Filed: Aug. 31, 2005

(65) Prior Publication Data

US 2007/0049716 A1    Mar. 1, 2007

(51) Int. Cl.
C08G 77/04    (2006.01)

(52) U.S. Cl. ........................................ 528/26

(58) Field of Classification Search ............... 528/26, 528/42; 525/100; 428/15, 848.8, 295; 438/708
See application file for complete search history.

(56) References Cited

U.S. PATENT DOCUMENTS

| | | | | |
|---|---|---|---|---|
| 4,464,506 A | * | 8/1984 | Alberts et al. | 524/588 |
| 4,504,645 A | | 3/1985 | Melancon | |
| 4,777,063 A | * | 10/1988 | Dubrow et al. | 427/503 |
| 5,397,848 A | * | 3/1995 | Yang et al. | 525/477 |
| 2002/0098364 A1 | | 7/2002 | Bernard et al. | |
| 2003/0059537 A1 | * | 3/2003 | Chilkoti et al. | 427/256 |
| 2005/0038217 A1 | * | 2/2005 | Ahn et al. | 528/15 |
| 2005/0154079 A1 | | 7/2005 | Walker et al. | |

FOREIGN PATENT DOCUMENTS

| | | |
|---|---|---|
| DE | 4420884 A1 | 12/1995 |
| EP | 0776944 A1 | 6/1997 |
| EP | 1132430 A1 | 9/2001 |
| WO | 2004/009675 A1 | 1/2004 |
| WO | 2004/111116 A1 | 11/2005 |

OTHER PUBLICATIONS

"The Engineering Tool Box", www.engineeringtoolbox.com/viscosity-converter-d_413.html.*
English Abstract of DE 4420884 published Dec. 21, 1995.
International Search Report mailed Oct. 10, 2006.
Article—*Surface-Directed, Graft Polymerization within Microfluidic Channels*, Hu et al., Analytical Chemistry, vol. 76, No. 7, Apr. 1, 2004, pp. 1865-1870.
Article—*Surface Modification of Poly(dimethylsiloxane) Microfluidic Devices by Ultraviolet Grafting*, Hu et al., Analytical Chemistry, vol. 74, No. 16, Aug. 15, 2002, pp. 4117-4123.
Product Information about *Dow Corning®* brand Silicone Encapsulants from Dow Corning Corporation, 2005, 8 pages.
Product Information about High Technology Silicone Materials—SYLGARD® 184 Silicone Elastomer, Base & Curing Agent from Dow Corning Corporation, 1991, 6 pages.
Dow Corning Corporation Material Safety Data Sheet on SYLGARD® Silicone Elastomer Base (Base Information), 2001, 6 pages.
Dow Corning Cororation Material Safety Data Sheet on SYLGARD® Silicone Elastomer Curing Agent (Curing Agent Information), 2002, 7 pages.

* cited by examiner

*Primary Examiner*—Randy Gulakowski
*Assistant Examiner*—Robert Loewe
(74) *Attorney, Agent, or Firm*—Dority & Manning, PA

(57) ABSTRACT

A silicone elastomer having hydrophilic properties is provided. The elastomer is a copolymer that is formed from a crosslinkable silicone composition, the silicone composition comprising an organopolysiloxane component and an ethylenically unsaturated monomer component. For example, the silicone composition may comprise:

i) an organopolysiloxane having the following general formula:

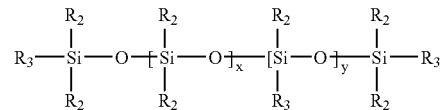

wherein,
each $R_2$ is individually selected from unsubstituted and substituted monovalent hydrocarbon groups containing from 1 to 20 carbon atoms;
each $R_3$ is individually selected from unsubstituted and substituted alkenyl groups containing from 1 to 20 carbon atoms;
$x \geq 1$; and
$y \geq 0$ and is an integer that is selected so that the organopolysiloxane contains an average of at least two alkenyl groups per molecule;
ii) an ethylenically unsaturated carboxylic acid;
iii) a silicon hydride crosslinking agent; and
iv) a platinum-based catalyst.

32 Claims, No Drawings

HYDROPHILIC SILICONE ELASTOMERS

BACKGROUND OF THE INVENTION

Poly(dimethylsiloxane) (PDMS) is an ideal stamp material for microfluidic devices and microcontact printing due to its elastic characteristics and ease of handling. However, PDMS suffers from an essential drawback. Because the surface is hydrophobic, using these materials with aqueous solutions has inherent problems due to the mismatch in polarities. For this reason, most microcontact printings techniques are restricted to the application of nonpolar inks, such as alkanethiols. Also, many microfluidic devices constructed from this material require active pumping to move the fluid through the hydrophobic channels. In response to such problems, attempts have been made to fabricate PDMS with a hydrophilic surface. For instance, PDMS has been rendered hydrophilic with an $O_2$-based plasma before inking them with a solution containing polar molecules. Unfortunately, however, plasma treatment generates a layer on the surface of the stamp that is unstable and brittle. Attempts have also been made to graft hydrophilic monomers onto the surface of the PDMS elastomer. For example, U.S. Patent Application Publication No. 2002/0098364 to Bernard, et al. describes a method in which the surface of a PDMS elastomer is grafted with a hydrophilic monomer. Such a graft polymerization technique, however, requires multiple reaction steps and is thus inefficient and costly to practice.

As such, a need currently exists for an improved technique for forming a silicone elastomer that possesses hydrophilic properties.

SUMMARY OF THE INVENTION

In accordance with one embodiment of the present invention, an elastomeric material is disclosed that has hydrophilic properties. The elastomeric material comprises a crosslinked copolymer formed from a silicone composition. The silicone composition comprises an organopolysiloxane component and an ethylenically unsaturated monomer component.

In accordance with another embodiment of the present invention, a crosslinked copolymer is disclosed that comprises an organopolysiloxane polymer backbone incorporated with an ethylenically unsaturated monomer component. Further, in accordance with still another embodiment of the present invention, an elastomer is disclosed that is formed by curing a silicone composition comprising:

i) an organopolysiloxane component that comprises an organopolysiloxane having the following general formula:

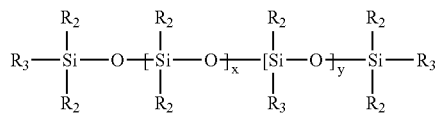

wherein,
each $R_2$ is individually selected from unsubstituted and substituted monovalent hydrocarbon groups containing from 1 to 20 carbon atoms;
each $R_3$ is individually selected from unsubstituted and substituted alkenyl groups containing from 1 to 20 carbon atoms;
$x \geq 1$; and
$y \geq 0$ and is selected so that the organopolysiloxane contains an average of at least two alkenyl groups per molecule;

ii) an ethylenically unsaturated monomer component that comprises an ethylenically unsaturated carboxylic acid;
iii) a silicon hydride crosslinking agent; and
iv) a platinum-based catalyst.

Other features and aspects of the present invention are discussed in greater detail below.

DETAILED DESCRIPTION OF REPRESENTATIVE EMBODIMENTS

Reference now will be made in detail to various embodiments of the invention, one or more examples of which are set forth below. Each example is provided by way of explanation of the invention, not limitation of the invention. In fact, it will be apparent to those skilled in the art that various modifications and variations may be made in the present invention without departing from the scope or spirit of the invention. For instance, features illustrated or described as part of one embodiment, may be used on another embodiment to yield a still further embodiment. Thus, it is intended that the present invention covers such modifications and variations as come within the scope of the appended claims and their equivalents.

Generally speaking, the present invention is directed to a silicone elastomer that possesses hydrophilic properties. The term "hydrophilic" generally refers to a material having a surface free energy such that it is wettable by an aqueous medium and may be measured in accordance with the ASTM-D-724-89 "contact angle" testing procedure. The hydrophilic elastomer of the present invention has a lower contact angle than a polymer that lacks an ethylenically unsaturated monomer component but is otherwise formed in an identical manner. For example, the hydrophilic elastomer may have an initial contact angle with water equal to or less than about 95°, in some embodiments less than about 85°, and in some embodiments, less than about 75°. The term "initial contact angle" refers to a contact angle measurement made within about 5 seconds of the application of water drops on a test specimen.

To produce the desired hydrophilic properties, an ethylenically unsaturated monomer component is reacted with an organopolysiloxane component to form a copolymer such that ethylenically unsaturated monomers become bonded along the organopolysiloxane backbone. This is in contrast to graft-type silicone elastomers in which the blocks are not located long the polymer backbone. Generally speaking, the organopolysiloxane component of the crosslinked copolymer is formed from one or more organopolysiloxanes having the following general formula:

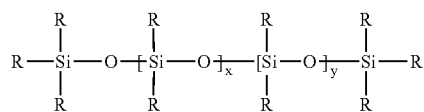

wherein,
$x \geq 1$;
$y \geq 0$; and
each R is individually selected from the group consisting of unsubstituted and substituted monovalent hydrocarbon groups containing from 1 to 20 carbon atoms. Some examples of such silicon atom-bonded, substituted or unsubstituted, monovalent hydrocarbon groups represented by "R" include alkyl groups (e.g., methyl, ethyl, propyl, isopropyl, butyl, isobutyl, tert-butyl, pentyl, neopentyl, hexyl, cyclohexyl, octyl, nonyl and decyl); aryl groups (e.g., phenyl, tolyl, xylyl and naphthyl); aralkyl groups (e.g., benzyl, phenylethyl, and phenylpropyl); alkenyl groups (e.g., vinyl, allyl, propenyl, isopropenyl, butenyl, hexenyl, cyclohexenyl and octenyl); and derivatives of the foregoing groups in which some or all of the hydrogen atoms are substituted with halogen atoms (e.g., chloromethyl, chloropropyl, bromoethyl, and trifluoropropyl); cyano groups (e.g., cyanoethyl); hydroxyl groups, ester groups, etc.

In most cases, the organopolysiloxanes contain at least two unsaturated functional groups to facilitate crosslinking. Particularly desired unsaturated functional groups are alkenyl groups. The alkyenyl groups typically contain from 2 to 12 carbon atoms and are represented by the following general formula:

wherein, $R_1$ is a single bond or an alkylene group containing from 2 to 10 carbon atoms. The alkylene group may be linear or branched. Some examples of alkenyl groups include vinyl, 2-propenyl, 3-butenyl, 5-hexenyl, 7-octenyl and 10-undecenyl. The organopolysiloxanes generally contain an average of at least 0.5, in some embodiments at least 1, and in some embodiments, at least 2 alkenyl groups per molecule. Likewise, the content of alkenyl groups is typically from about 0.0001 to about 20 mol %, in some embodiments from about 0.001 to 10 mol %, and in some embodiments, from about 0.01 to 5 mol % of the entire "R" groups. The alkenyl groups may be bonded to silicon atoms at one or more ends of the molecular chain ("terminal") and/or to silicon atoms within the molecular chain. It is normally desired that at least two alkenyl groups are located at the terminals of the molecular chain to reduce the likelihood that steric hindrance will inhibit the crosslinking reaction. One particular example of such an alkenyl-containing organopolysiloxane is set forth below:

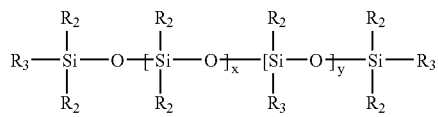

wherein, each $R_2$ is individually selected from unsubstituted and substituted monovalent hydrocarbon groups containing from 1 to 20 carbon atoms;

each $R_3$ is individually selected from unsubstituted and substituted alkenyl groups containing from 1 to 20 carbon atoms;

$x \geq 1$; and $y \geq 0$ and is selected so that the molecule contains an average of at least two alkenyl groups per molecule. Preferably, $R_2$ is an unsubstituted monovalent hydrocarbon group having less than 7 carbon atoms or a halogenated alkyl group having less than 7 carbon atoms. For example, $R_2$ may be an alkyl group (e.g., methyl or ethyl); a cycloalkyl group (e.g., cyclohexyl); an aryl group (e.g., phenyl); or derivatives of the foregoing groups in which some or all of the hydrogen atoms are substituted with halogen atoms (e.g., chloromethyl, chloropropyl, bromoethyl, and trifluoropropyl); cyano groups (e.g., cyanoethyl); hydroxyl groups, ester groups, etc.

In one particular embodiment of the present invention, one or more organopolysiloxanes are employed that are vinyl-terminated and have the following general formula:

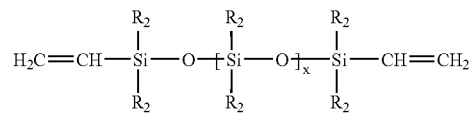

wherein, each $R_2$ is individually selected from unsubstituted and substituted monovalent hydrocarbon groups containing from 1 to 20 carbon atoms; and x is from 100 to 1200.

The organopolysiloxanes may contain at least about 5 mol %, in some embodiments from about 5 mol % to about 50 mol %, and in some embodiments, from about 10% to about 30 mol % of diphenylsiloxane units in the diorganosiloxane units of which the backbone is constructed, based on the entire base polymer. In addition or alternatively, the organopolysiloxanes may contain at least about 10 mol %, in some embodiments from about 10 mol % to about 50 mol %, and in some embodiments, from about 25% to about 35 mol % of methylphenylsiloxane units in the diorganosiloxane units of which the backbone is constructed, based on the entire base polymer. Some examples of suitable organopolysiloxanes include dimethylvinylsiloxy end group-capped polydimethylsiloxane, methyldivinylsiloxy end group-capped polydimethylsiloxane, dimethylvinylsiloxy end group-capped dimethylsiloxane (80 mol %)/methylphenylsiloxane (20 mol %) copolymers, dimethylvinylsiloxy end group-capped dimethylsiloxane (80 mol %)/diphenylsiloxane (20 mol %) copolymers, dimethylvinylsiloxy end group-capped dimethylsiloxane (90 mol %)/diphenylsiloxane (10 mol %) copolymers, and trimethylsiloxy end group-capped dimethylsiloxane/methylvinylsiloxane copolymers. Besides the above-mentioned polymers, other polymers may also be utilized in the present invention. For instance, some suitable vinyl-modified silicones include, but are not limited to, vinyldimethyl terminated polydimethylsiloxanes; vinylmethyl, dimethylpolysiloxane copolymers; vinyldimethyl terminated vinylmethyl, dimethylpolysiloxane copolymers; divinylmethyl terminated polydimethylsiloxanes; polydimethylsiloxane, mono vinyl, mono n-butyldimethyl terminated; and vinylphenylmethyl terminated polydimethylsiloxanes. Further, some methyl-modified silicones that can be used include, but are not limited to, dimethylhydro terminated polydimethylsiloxanes; methylhydro, dimethylpolysiloxane copolymers; methylhydro terminated methyloctyl siloxane copolymers; and methylhydro, phenylmethyl siloxane copolymers.

The organopolysiloxanes may also contain one or more hydrolyzable groups in addition to the two unsaturated groups. In such cases, the polymers may be cured using a mechanism other than heat. For example, moisture-curing groups may be located on the organopolysiloxane to impart moisture cure properties. Suitable hydrolyzable groups may include alkoxy groups (e.g., methoxy, ethoxy and propoxy); alkoxyalkoxy groups (e.g., methoxyethoxy, ethoxyethoxy and methoxypropoxy); acyloxy groups (e.g., acetoxy and octanoyloxy); ketoxime groups (e.g., dimethylketoxime, methylketoxime and methylethylketoxime); alkenyloxy groups (e.g., vinyloxy, isopropenyloxy, and 1-ethyl-2-methylvinyloxy); amino groups (e.g., dimethylamino, diethylamino and butylamino); aminoxy groups (e.g., dimethylaminoxy and diethylaminoxy); and amide groups (e.g., N-methylacetamide and N-ethylacetamide).

The organopolysiloxanes may be used in any amount sufficient to achieve the desired structural integrity and elastomeric characteristics. In most embodiments, the organopolysiloxanes are present in an amount from about 15 wt. % to about 90 wt. %, and in some embodiments, from about 20 wt. % to about 50 wt. % of the entire crosslinkable silicone composition. Further, the organopolysiloxanes typically have a viscosity at 23° C. of from about 10 to about 500,000 mPa-s, and in some embodiments, from about 400 to about 200,000 mPa-s. The organopolysiloxanes may also be homopolymers, copolymers, or mixtures thereof. Likewise, the molecular structure of the organopolysiloxanes may be straight chain, branched chain, partially branched straight chain, and dendritic (three-dimensional network) structures.

As noted above, the hydrophilic component of the crosslinked copolymer of the present invention is formed from one or more substituted or unsubstituted, ethylenically unsaturated monomers. The monomers may contain or be readily modified to contain one or more polar functional groups (i.e., "polar monomers"). Suitable polar functional groups include, for instance, carboxyl groups (—COOH), hydroxyl groups (—OH), and amine groups (—NH$_2$). One particular class of suitable monomers that contain polar carboxyl groups are ethylenically unsaturated carboxylic acids, which are unsubstituted or substituted with functional groups, such as esters, cyano groups, ethers, acetals, etc. Specific examples of ethylenically unsaturated carboxylic acids include acrylic acid, methacrylic acid, itaconic acid, sorbic acid, fumaric acid, maleic acid, oleic acid, as well as anhydrides thereof (e.g., maleic anhydride). Still other suitable ethylenically unsaturated monomers may include derivatives of ethylenically unsaturated carboxylic acids, such as amide derivatives (e.g., acrylamide and methacrylamide); urea derivatives (e.g., ethylene urea ethyl methacrylamide and ethylene urea ethyl methacrylate); phosphate or phosphonate derivatives (e.g., vinylphosphonic acid and vinylidenephosphonic acid); sulfonic derivatives (e.g., vinylsulfonic acid, vinylbenzenesulfonic acid, α-acrylamidomethyl-propanesulfonic acid, and 2-sulfoethylene methacrylate); amine derivatives (e.g., dimethylaminoethyl(meth)acrylate, dimethylaminopropyl(meth)acrylate, di(tert-butyl)aminoethyl (meth)acrylate, dimethyl-aminomethyl(meth)acrylamide and dimethylaminopropyl(meth)acrylamide); and so forth. Still other suitable ethylenically unsaturated monomers may also be used in the present invention, such as styrene and styrene derivatives (e.g., alkyl styrene).

The particular type of ethylenically unsaturated monomer selected depends on a variety of factors, including the nature of the organopolysiloxane, crosslinking agent, catalyst, and so forth. In many cases, for instance, it is desirable to minimize steric hindrance to facilitate the incorporation of the ethylenically unsaturated monomer into the organopolysiloxane backbone. As an example, acrylic acid and methacrylic acid have the following structures:

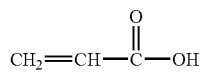

Acrylic acid

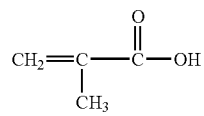

Methacrylic acid

Due to the absence of an additional CH$_3$ group, acrylic acid has a lower degree of steric hindrance than methacrylic acid, and as such, may be more readily incorporated into the backbone the polymer molecule. Similarly, the stereoisomeric nature of the molecule may also affect its ability to be incorporated into the polymer backbone. For instance, cis isomers generally exhibit a lower degree of steric hindrance than trans or geminal isomers, and thus, are more readily incorporated into the polymer backbone. As an example, the cis and trans isomers of oleic acid are set forth below:

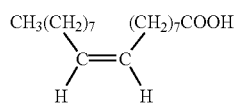

cis

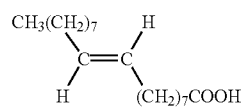

trans

As a result the geometry of the molecules, the cis isomer of oleic acid will generally exhibit a lower degree of steric hindrance than the corresponding trans isomer.

Besides steric hindrance, other factors may also be considered when selecting the ethylenically unsaturated monomers. For example, the crosslinked polymer of the present invention may be utilized as a patterned elastomer in certain applications (e.g., stamps, microfluidics, etc.). To function effectively as an elastomer, the polymer typically possesses good bulk properties and structural integrity. In this regard, some types of monomers are believed to have a lower effect on structural integrity than other monomers. Methacrylic acid, for instance, is believed to have a smaller effect on the bulk properties of the crosslinked polymer than acrylic acid. Thus, although possessing a greater degree of steric hindrance, it may be desirable in certain embodiments to use methacrylic acid monomer.

Another factor to consider when selecting the ethylenically unsaturated monomer is its reactivity with a crosslinking catalyst. The proton/acidic nature of certain types of ethylenically unsaturated monomers may adversely interfere with the crosslinking reaction by capping the reactive sites. To counteract this effect, monomers may be employed that contain nonpolar groups that are converted to polar groups when desired (e.g., after crosslinking). For example, acid chlorides/anhydrides of ethylenically unsaturated carboxylic acids (e.g., oleyl chloride) may be initially employed in some embodiments. Still other suitable monomers that contain nonpolar groups include substituted and unsubstituted esters of ethylenically unsaturated carboxylic acids, such as methyl acrylate, ethyl acrylate, propyl acrylate, butyl acrylate, ethylhexyl acrylate, lauryl acrylate, methyl methacrylate, ethyl methacrylate, propyl methacrylate, butyl methacrylate, lauryl methacrylate, isobutylene methacrylate, hydroxyethyl(meth) acrylate and acetoacetoxy(meth)acrylate. The nonpolar groups of such monomers may be converted to a polar group through a variety of different mechanisms. In one embodiment, for example, after incorporation, nonpolar oleyl chloride is hydrolyzed so that the chlorine atom is replaced by hydroxide to form oleic acid, a polar molecule.

The ethylenically unsaturated monomers may generally be employed in the crosslinkable silicone composition in any amount sufficient to impart the desired hydrophilic properties. However, the ethylenically unsaturated monomers may inhibit the structural properties of the crosslinked elastomer if used in too great an amount. Thus, in most cases, the ethylenically unsaturated monomers are employed in an amount of from about 0.5 to about 10 wt. %, in some embodiments from about 1 to about 8 wt. %, and in some embodiments, from about 2 to about 6 wt. % of the crosslinkable silicone composition.

Any of a variety of different curing mechanisms may be employed in the present invention to crosslink the organopolysiloxane and ethylenically unsaturated monomer components. Suitable techniques include, for instance, condensation polymerization, photopolymerization, addition polymerization, and so forth. One suitable type of addition polymerization mechanism is free radical polymerization. Free radical polymerization is initiated by a free radical initiator, such as a peroxide or azo initiator. Examples of suitable peroxide catalysts include, for instance, cyclohexanone peroxide; 3,3,5-trimethyl cyclohexanone peroxide; methyl cyclohexanone peroxide; 1,1-bis(tert-butylperoxy)-3,3,5-trimethyl cyclohexane; 1,1-bis(tert-butylperoxy)cyclohexane; n-butyl-4,4,-bis(tert-butylperoxy)valerate; cumene hydroperoxide; 2,5-dimethylhexane-2,5-dihydroperoxide; 1,3-bis(tert-butylperoxy)-m-isopropyl)benzene; 2,5-dimethyl-2,5-di(tert-butylperoxy)hexane; diisopropylbenzene peroxide; tert-butylcumyl peroxide; decanoyl peroxide; lauroyl peroxide; benzoyl peroxide; 2,4-dichlorobenzoyl peroxide; bis(tert-butylcyclohexyl)peroxycarbonate; tert-butylperoxybenzoate; and 2,5-dimethyl-2,5-di(benzoylperoxy)hexane. Likewise, examples of azo catalysts include 2,2'-azobis(isobutyronitrile) ("AIBN"); 1,1-azobis(cyclohexane-1-carbonitrile); azocumene; 2,2'-azobis(2-methylbutyronitrile); 2,2'-azobis-dimethylvaleronitrile; 4,4'-azobis(4-cyanovaleric acid); 2-(tert-butylazo)-2-cyanopropane; 2,2'-azobis(2,4,4-trimethylpentane); 2,2'-azobis(2-methylpropane); and dimethyl 2,2'-azobis(2-methylpropionate).

Addition polymerization may also be accomplished using a hydrosilation reaction. Specifically, in the presence of certain types of catalysts, a silicone hydride crosslinking agent may undergo an addition reaction with the silicon-bonded unsaturated groups (e.g., alkenyl groups) of the organopolysiloxane to cure the composition. This is commonly referred to as a "hydrosilation" reaction. Hydrosilation crosslinking agents may have a molecular structure that is straight chain, branched chain, partially branched straight chain, and dendritic (three-dimensional network) structures. The crosslinking agent may also be a homopolymer, copolymer, or mixture thereof. Particularly suitable crosslinking agents have a viscosity from about 0.01 to about 10 Pa·s at 25° C. Any amount of the crosslinking agent may be employed to provide the desired degree of crosslinking. For instance, the crosslinking agent may be employed in an amount from about 1 to about 40 parts, in some embodiments from about 5 to about 30 parts, and in some embodiments, from about 7 to about 20 parts by weight per 100 parts of the organopolysiloxane. Likewise, the crosslinking agent may be present in an amount from about 1 wt. % to about 10% of the entire composition.

Hydrosilation crosslinking agents typically contain an average at least two silicon-bonded hydrogen atoms per molecule, and in some embodiments, an average of at least three silicon-bonded hydrogen atoms per molecule. The remaining valances on the silicon atoms may contain organic groups selected from hydroxyl groups; alkyl groups (e.g., methyl or ethyl), cycloalkyl groups (e.g., cyclohexyl); halogenated alkyl groups (e.g., chloromethyl, 3-chloropropyl, or 3,3,3-trifluoropropyl); and aryl groups (e.g., phenyl). Specific examples of suitable crosslinking agents include polymethylhydrogensiloxane; trimethylsiloxy-terminated polymethylhydrogensiloxane; copolymers of dimethylsiloxane, methylhydrogensiloxane, and trimethylsiloxane units; and copolymers of dimethylsiloxane, methylhydrogensiloxane, and dimethylhydrogensiloxane units. In one particular embodiment, for example, the hydrosilation crosslinking agent has the following general formula:

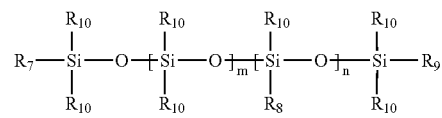

wherein, $R_7$, $R_8$ and $R_9$ are each independently selected from unsubstituted and substituted monovalent hydrocarbon groups containing from 1 to 20 carbon atoms, so long as at least two of $R_7$, $R_8$ and $R_9$ are hydrogen;

each $R_{10}$ is independently selected from unsubstituted and substituted monovalent hydrocarbon groups containing from 1 to 20 carbon atoms;

m is an integer from 10 to 1,000; and n is an integer from 1 to 20.

To facilitate curing, the sum of the average number of silicon-bonded alkenyl groups per molecule in the organopolysiloxane and the average number of silicon-bonded hydrogen atoms per molecule in the crosslinking agent is typically greater than 4. Likewise, the molar ratio of silicon-bonded hydrogen atoms to unsaturated hydrocarbon groups in the organopolysiloxane may also be controlled to achieve certain properties of the crosslinked elastomer. The optimum ratio depends in part on the molecular weight of the organopolysiloxane and the type of crosslinking agent. In most embodiments, however, the concentrations of the crosslinking agent and the organopolysiloxane are selected to achieve a molar ratio of silicon-bonded hydrogen atoms to alkenyl radicals from about 0.5:1 to about 20:1, and in some embodiments, from about 1:1 to about 5:1.

The hydrosilation reaction is generally initiated by a catalyst that promotes the addition of the silicon-bonded hydrogen of the crosslinking agent to the unsaturated functional group of the organopolysiloxane. Any hydrosilation catalyst may be used in the present invention to accomplish the desired reaction. For instance, metal complexes selected from Group VIII transition metals, such as platinum, rhodium, cobalt, palladium, and nickel, may be employed in the present invention. Particularly suitable metal catalysts are metallic and finely divided platinum, which may supported on supports such as silica, alumina or activated carbon; compounds or complexes of platinum, such as platinum halides (e.g., Pt(IV)Cl$_4$, H$_2$Pt(IV)Cl$_6$.6H$_2$O, Na$_2$Pt(II)Cl$_4$.4H$_2$O); platinum-olefin complex Pt(II) (1,5-cyclooctadiene)dimethyl); platinum-alcohol complexes; platinum-alkoxide complexes; platinum-ether complexes; platinum-aldehyde complexes; platinum-ketone complexes (e.g., Pt(II) acetylacetonate and the reaction product of H$_2$PtCl$_6$.6H$_2$O and cyclohexanone); platinum-vinylsiloxane complexes (e.g., Pt(0)-1,3-divinyl-1,1,3,3-tetramethyldisiloxane complexes); and platinum-halide complexes (e.g., bis(gamma-picoline)platinum dichloride, trimethylenedipyridineplatinum dichloride, dicyclopentadieneplatinum dichloride, dimethylsulfoxideethyleneplatinum(II) dichloride, cyclooctadieneplatinum dichloride, norbornadieneplatinum dichloride, gamma-picolineplatinum dichloride, and cyclopentadieneplatinum dichloride). In view of their hydrosilation reactivity and relative availability, chloroplatinic acid (H$_2$Pt(IV)Cl$_6$.6H$_2$O), platinum-vinylsiloxane complexes, platinum-olefin complexes, and platinum (II) bisacetylacetonate, are particularly useful in the present invention. The term "platinum-vinylsiloxane complexes" generally refer to compounds in which a siloxane-based ligand containing a vinyl group coordinates to a platinum atom. One example of such a siloxane-based ligand is 1,1,3,3-tetramethyl-1,3-divinyldisiloxane. Likewise, the term "platinum-olefin complexes" generally refer to compounds in which an olefin-based ligand coordinates to a platinum atom. Specific examples of olefin-based ligands include 1,5-hexadiene, 1,7-octadiene, 1,9-decadiene, 1,11-dodecadiene, and 1,5-cyclooctadiene.

Although any hydrosilation catalyst may generally be employed, certain types of catalysts may better enhance the ability of the ethylenically unsaturated monomer to be incorporated into the crosslinked polymer network without adversely affecting the bulk properties of the elastomer. For example, some types of platinum catalysts that contain amino functional groups may actually inhibit the hydrosilation reaction. However, active platinum (0) catalysts, such as platinum (0) vinylsiloxane complexes, such as Pt(0)-1,3-divinyl-1,1,3,3-tetramethyldiloxane, may allow hydrosilation reactions to occur at moderate temperatures.

To assist in dispersing the catalyst into the silicone composition, it may be dissolved or dispersed in a solvent prior to use. In such cases, the catalyst typically constitutes from about 0.01 to about 5 wt. %, in some embodiments from about 0.1 to about 3 wt. %, and in some embodiments, from about 0.5 to about 2 wt. % of the solvent dispersion. Any of a variety of solvents may generally be employed, such as organic solvents, silicone fluids, and so forth. Organic solvents are particularly desired in that they are less likely to interfere with the crosslinking mechanism. The solvents also are volatile and able to be removed from the cured material after crosslinking. Some examples of suitable organic solvents for use in the hydrosilation reaction include aliphatic hydrocarbons (e.g., pentane, hexane, heptane, pentamethylheptane and petroleum distillation fractions); aromatic hydrocarbons (e.g., benzene, toluene and xylenes: ortho-xylene, para-xylene and meta-xylene); halogenated aliphatic or aromatic hydrocarbons (e.g., tetrachloroethylene); ethers (e.g., tetrahydrofuran and dioxane); and so forth. Commercially available platinum catalysts that are dispersed in a xylene solvent may be obtained from United Chemical Technologies, Inc. of Bristol, Pa. under the names PC072, PC073, and PC074.

If desired, other additives may also be incorporated into the crosslinkable silicone composition to provide a variety of benefits. For instance, one or more fillers may be utilized to improve the hardness and structural integrity of the resulting silicone elastomer. Examples of such fillers include silica, quartz, calcium carbonate, titanium dioxide, diatomaceous earth, aluminum oxide, aluminum hydroxide, zinc oxide, zinc carbonate, and so forth. As is well known in the art, many fillers (e.g., silica) contain hydroxyl functionalities that cause them to be hydrophilic. Hydrophilic fillers may, however, be difficult to incorporate into a silicone composition that contains hydrophobic organopolysiloxanes. Thus, the surface of such fillers may optionally be treated with organosilanes or organosiloxanes to render it hydrophobic. Examples of such hydrophobic surface treatments include methyltrimethoxysilane, vinyltrimethoxyethoxysilane, or a similar organoalkoxysilane; trimethylchlorosilane or a similar organohalosilane; hexamethyldisilazane, or a similar organosilazane; dimethylsiloxane oligomer having both molecular terminals capped with hydroxyl groups, methylphenylsiloxane oligomer having both molecular terminals capped with hydroxyl groups, methylvinylsiloxane oligomer having both molecular terminals capped with hydroxyl groups, or similar siloxane oligomers; higher fatty acids, or their metal salts. Other chemically-modified fillers are also described in U.S. Pat. No. 5,990,223 to DeGroot, Jr. and U.S. Pat. No. 6,384,125 to Bergstrom, et al., which are incorporated herein in their entirety by reference thereto for all purposes.

Besides fillers, the crosslinkable silicone composition of the present invention may also contain an effective amount of a self-bonding organosilane (i.e., adhesion promoter) to help the resulting elastomer better adhere to a surface. Some examples of such organosilanes include vinyltrichlorosilane, vinyltrimethoxysilane, vinyltriethoxysilane, vinylmethyldichlorosilane, vinyl methyldimethoxysilane, vinyl methyldiethoxysilane, 5-hexenyltrimethoxysilane, 3-glycidoxypropyltrimethoxysilane, 3-glycidoxypropyltriethoxysilane, 3-glycidoxypropylmethyldimethoxysilane, 3-glycidoxypropylmethyldiethoxysilane, 3-(meth)acryloxypropyltrimethoxysilane, 3-(meth)acryloxypropyltriethoxysilane, 3-(meth)acryloxypropylmethyldimethoxysilane, 3-(meth)acryloxypropylmethyldiethoxysilane, 4-vinylphenyltrimethoxysilane, 3-(4-vinylphenyl)propyltrimethoxysilane, 4-vinylphenylmethyltrimethoxysilane, 3-aminopropyltrimethoxysilane, 3-aminopropyltriethoxysilane, 3-aminopropylmethyldimethoxysilane, 3-aminopropylmethyldiethoxysilane, 3-(2-aminoethyl)aminopropyltrimethoxysilane, 3-mercaptopropyltrimethoxysilane, 3-mercaptopropyltriethoxysilane, 3-mercaptopropylmethyldimethoxysilane, 3-mercaptopropylmethyldiethoxysilane, and partial hydrolyzates thereof.

The polymerization conditions used to form the crosslinked silicone elastomer may vary as is well known to those skilled in the art. For example, the temperature at which crosslinking occurs is generally at or near room temperature, such as from about 20° C. to about 30° C. Alternatively, deviations from ambient room temperature may be employed to induce or accelerate the crosslinking reaction. Polymerization may occur using any technique known in the art. For example, bulk polymerization, solution polymerization, suspension polymerization, emulsion polymerization, etc., may be employed. Solution polymerization is conducted by a process that includes dissolving the monomers and/or other constituents in a solvent and stirring the mixture under a nitrogen or oxygen atmosphere. The solvent may be water and/or an organic solvent, such as methanol, ethanol, isopropanol, toluene, xylene, etc. Although not required, it is typically desired that one or more polymer constituents are kept separate until it is desired to induce crosslinking. In a two-part system, for instance, the polymerization initiator (e.g., platinum catalyst) and organopolysiloxane are kept separate until it is desired to induce crosslinking. The remaining constituents may be likewise added to either part to achieve the desired properties.

Once the desired level of crosslinking has occurred, the elastomer may be subjected to an extraction method, such as Soxhlet extraction, liquid-liquid extraction, accelerated solvent extraction, microwave-assisted solvent extraction, solid-phase extraction, supercritical fluid extraction, etc., as is well known in the art. Such extraction methods generally involve contacting the elastomer with an organic solvent (e.g., tetrahydrafuran or ethanol) over a period of time. Without intending to be limited by theory, it is believed that extraction helps remove unreacted hydrophobic components from the elastomer, thereby rendering it more hydrophilic.

The crosslinked elastomers of the present invention contain polymer chains that readily undergo torsional motion to permit uncoiling of the backbone chains in response to a force, with the backbone chains recoiling to assume the prior shape in the absence of the force. The elastomers deform when force is applied, but then return to their original shape when the force is removed. The elasticity may be characterized by a Young's modulus, which is typically from about 1 Pa to about 1000 GPa, in some embodiments from about 10 Pa to about 1 GPa, in some embodiments, from about 100 Pa to about 1 MPa. As a result of its elasticity and good strength properties, the crosslinked elastomer may be used in wide variety of applications. One particularly suitable use of the crosslinked elastomer is as a microcontact printing stamp. Microprinting is a soft lithographic fabrication technique that permits the patterning of microfeatures having a desired physical, chemical or biological property. For example, an elastomeric stamp may be used to transfer an ink to the substrate surface through contact. The stamp is fabricated by casting the silicone composition on a master having the inverse of the desired print pattern, which will thereby result in the desired channel pattern. Masters are prepared using standard photolithographic techniques, or constructed from existing materials having microscale surface features.

In one embodiment, a photolithographically-produced master is formed by applying the crosslinkable silicone composition (e.g., a mixture of organopolysiloxane, ethylenically unsaturated monomer, platinum catalyst, hydrosilation crosslinking agent, and other optional additives) to a support, such as a silicon wafer, glass, or polymeric material. In some cases, the high surface energy of the support causes it to undesirably adhere to the crosslinked elastomer. Thus, the support may optionally be pre-treated with an agent that reduces surface energy (i.e., passivated). Particularly desirably surface energy reducing agents are those that exhibit water repellant properties, such as fluorocarbon compounds. The fluorocarbon compound may contain a silane coupling agent having the following general formula:

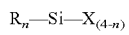

wherein, n is 1 to 3;

R is an alkyl group; and

X is a hydrolyzable group, such as a halogen or ester (e.g., methoxy, ethoxy, or acetoxy group). By using a fluorine silane coupling agent (fluoroalkyl silane) having a fluoroalkyl group for R as a representative example of the silane coupling agent, the wettability can be lowered. Such fluorocarbon compounds may include, for instance, heptadecafluoro tetrahydrodecyl triethoxysilane, heptadecafluoro tetrahydrodecyl trichlorosilane, tridecafluoro tetrahydrooctcyl trichlorosilane, and triflouropropyl trimethoxysilane. Other suitable materials include fluorine resins, such as polytetrafluoroethylene, perfluoroalkoxyalkane, perfluoroethylene propylene copolymer, ethylene-tetrafluoroethylene copolymer, polyvinylidene fluoride, polychlorotrifluoroethylene, ethylenechlorotrifluoroethylene copolymer, polytetrafluoroethyleneperfluorodioxol copolymer, polyvinylfluoride, and so forth.

Regardless of the manner in which it is formed, the support is applied with the desired silicone composition for curing. Typically, curing is accomplished at room temperature (i.e., from about 20° C. to about 30° C.), although higher temperatures may be employed to accelerate the curing reaction. Once cured, the elastomer is gently peeled from the support. The resulting elastomeric stamp is "inked" by exposing the stamp to a solution of the desired material. This is typically done by placing the stamp face down in the solution for about 10 seconds to about 10 minutes. The stamp is allowed to dry, either under ambient conditions or by exposure to a stream of air or nitrogen gas. Following inking, the stamp is applied to the surface of the substrate. Light pressure is used to ensure complete contact between the stamp and the substrate. After about 1 second to about 5 minutes, the stamp is then gently peeled from the substrate. Following removal of the stamp, the substrate may be rinsed and dried.

Using techniques such as described above, the elastomeric stamp of the present invention may be employed in a variety of applications. For instance, due to its hydrophilic nature, the elastomeric stamp of the present invention may advantageously be employed to effectively print polar molecules onto a surface. In some embodiments, the elastomeric stamp may be used to print biological molecules (e.g., antibodies) onto a surface for use in a biosensor. Biological molecules are generally considered to be polar due to the presence of various polar functional groups, such as amino groups, on the molecule surface. The biological molecule may be a member of a specific binding pair, i.e., two different molecules where one of the molecules chemically and/or physically binds to the second molecule. For instance, immunoreactive specific binding members may include antigens, haptens, aptamers, antibodies (primary or secondary), and complexes thereof, including those formed by recombinant DNA methods or peptide synthesis. An antibody may be a monoclonal or polyclonal antibody, a recombinant protein or a mixture(s) or fragment(s) thereof, as well as a mixture of an antibody and other specific binding members. The details of the preparation of such antibodies and their suitability for use as specific binding members are well known to those skilled in the art. Other common specific binding pairs include but are not limited to, biotin and avidin (or derivatives thereof), biotin and streptavidin, carbohydrates and lectins, complementary nucleotide sequences (including probe and capture nucleic acid sequences used in DNA hybridization assays to detect a target nucleic acid sequence), complementary peptide sequences including those formed by recombinant methods, effector and receptor molecules, hormone and hormone binding protein, enzyme cofactors and enzymes, enzyme inhibitors and enzymes, and so forth. Furthermore, specific binding pairs may include members that are analogs of the original specific binding member. For example, a derivative or fragment of the analyte (i.e., "analog") may be used so long as it has at least one epitope in common with the analyte.

The ability to print polar, biological molecules onto a substrate in a certain pattern provides a variety of benefits. For example, a patterned layer of a biological material may be used in optical sensing devices to produce optical diffraction patterns upon exposing a polymer film to an analyte and light (i.e., reflected or transmitted through the film). The diffraction pattern differs depending on the reaction of the biological material with the analyte of interest. Various examples of such optical diffraction systems are described in U.S. Pat. No. 6,436,451 to Everhart, et al., which is incorporated herein in its entirety by reference thereto for all purposes.

The elastomeric stamp may also be employed to apply one or more self-assembling organic monolayers onto a substrate surface. The monolayers may self assemble on the substrate to act as nanometer resist, thereby protecting the supporting substrate from corrosion and allowing for the selective placement of fluids on hydrophilic regions of the pattern. Such self-assembling monolayers may also be used in optical diffraction systems in which the diffraction pattern differs depending on the reaction of the self-assembling monolayer with the analyte of interest. The self-assembling monolayers are typically formed from an alkanethiol "ink" that does not undergo reactive spreading (after application to the substrate). For stamping in air, autophobic alkanethiols (e.g., hexadecanethiol) may be employed. Microcontact printing of non-autophobic alkanethiols (e.g., $HS(CH_2)_{15}COOH$) may be more suitable when stamping in a liquid. Various techniques for applying a self-assembling monolayer to a substrate for u, such as a metal-coated polymer film, are described in U.S. Pat. No. 5,512,131 to Kumar, et al.; U.S.

Pat. No. 6,020,047 to Everhart; and U.S. Pat. No. 6,048,623 to Everhart, et al., which are incorporated herein in their entirety by reference thereto for all purposes.

Fluidic microchannels may also be fabricated on a substrate using the elastomeric material of the present invention. In one embodiment, for example, the elastomeric material is inked with a material that significantly alters the surface energy of the substrate so that it may be selectively "wettable" to a monomer or pre-polymer (if post-cured), or polymer used to make a microchannel. The elastomeric material could have raised features to print the desired microchannel pattern. An exemplary printing method may involve inking the elastomeric material with a wetting agent, such as hydrophilic self-assembling monolayers (SAMs), including those that are carboxy-terminated. In another embodiment, hydrophobic wetting agents may be utilized. Specifically, the inverse of the desired pattern is printed onto a hydrophilic substrate. Upon exposure of the monomer or pre-polymer (if post-cured), or polymer, the inks would selectively wet only on the substrate, thereby resulting in the desired channel pattern. Another technique might simply involve inking an elastomeric material with a solution of the monomer or pre-polymer (if post-cured), or polymer. The elastomeric material may have raised features to match the desired channel pattern so that a direct transfer of the channel-forming material would occur on the substrate.

The present invention may be better understood with reference to the following examples.

EXAMPLE 1

Initially, the following components were mixed to form a solution: 10.0 grams of Sylgard® 184 silicone elastomer base; 1.0 gram of Sylgard® 184 elastomer curing agent; 1.16 milliliters (1.0 gram) of toluene; 0.500 milliliters of freshly distilled acrylic acid; and a few grains of AIBN. Sylgard® 184 silicone elastomer base is commercially available from Dow Corning Corp. and believed to contain (1) >60 wt. % dimethylvinyl-terminated dimethyl siloxane; (2) 30-60 wt. % dimethylvinylated and trimethylated silica; (3) 1-5 wt. % tetra(trimethysiloxy)silane; and (4) 0.7 wt. % xylene. Sylgard® 184 elastomer curing agent is also available from Dow Corning Corp. and believed to contain (1) 40-70 wt. % of dimethyl, hydrogen siloxane; (2) 15-40 wt. % of dimethylvinyl-terminated dimethyl siloxane; (3) 10-30 wt. % of dimethylvinylated and trimethylated silica; (4) tetramethyl tetravinyl cyclotetrasiloxane; (5) a platinum-based hydrosilation catalyst; and (6) 0.3 wt. % xylene.

Thereafter, approximately 70 vol. % of the solution was poured into an aluminum weighing boat and the remainder poured into a scintillation vial. The weigh boat was placed into a desiccator with a slow flow of nitrogen through it. The scintillation vial was left open to the atmosphere. Both samples were warmed slightly to increase the rate of thermal decomposition of the initiator. Care was taken not to overheat the samples, as acrylic acid has a relatively low boiling point of about 110° C.

The sample under the nitrogen atmosphere cured faster than the vial left exposed to oxygen, and the resulting polymer had a greater hardness than that cured under ambient conditions. The PDMS cured under nitrogen, however, could not be removed from the pan without damaging the polymer. Both of the samples also had a few bubbles entrained in the resin near the site of the AIBN addition. Presumably, these bubbles were from the decomposition of the AIBN (nitrogen is a by-product). A similar experiment was carried out using benzoyl peroxide as the initiator. These samples lacked the bubbles found in the AIBN cured samples. Further, the samples with the acrylic acid were wettable by 0.1 N NaOH, implying that the acrylic acid had been incorporated into the polymer.

EXAMPLE 2

The effectiveness of following hydrosilation catalysts were tested in accordance with the procedure set forth in Example 1.

1 Pt(0)-1,3-divinyl-1,1,3,3-tetramethyidisloxane complex, 0.1 M in xylenes
2 Pt(0)-1,3-divinyl-1,1,3,3-tetramethyldisloxane complex, 0.104 M in methylvinylsiloxanes
3 (1,5 cylcooctadiene)dimethyl Pt(II)
4 Hydrogen hexachloroplatinate (IV) hydrate
5 Pt(II) acetylacetonate Catalysts 1 and 2 greatly enhanced the overall rate of cure when added to the PDMS. Likewise, catalyst 3 produced a slight increase in the rate of cure, while catalysts 4 and 5 failed to show a noticeable effect. To better evaluate the ability of these catalysts to incorporate polar dopants (e.g., acrylic acid) into PDMS, attempts were made to remove the original catalyst from the resin by adding isopropyl alcohol ("IPA"). Specifically, one milliliter of IPA was added to a mixture containing 10 grams of Sylgard® 184 elastomer base and 1.0 gram of Sylgard® 184 curing agent. The reaction mixture failed to crosslink. Thereafter, 20 milliliters of catalyst 1 was added to the mixture; however, the PDMS still failed to crosslink. This implied that the IPA (and presumably other polar compounds) did not inactivate the original catalyst, but instead incorporated the polar compounds into the polymer, thereby occupying the active sites and preventing crosslinking.

EXAMPLE 3

The ability to incorporate acrylic acid into PDMS using a platinum-based catalyst was tested. Specifically, a reaction mixture was formed from 10.0 grams of Sylgard® 184 elastomer base, 1.0 gram of Sylgard® 184 curing agent, and 0.500 milliliters of distilled acrylic acid. This solution was divided in half. To one half, 10 milliliters of a Pt(0)-1,3 divinyl-1,1,3,3-tetramethyldisloxane complex (0.1M in xylenes) catalyst was then added. Both samples were tightly capped and allowed to stand at room temperature. After several hours, the control portion was still a viscous liquid, and the portion with the catalyst had begun to cure. After sitting overnight, the control remained a liquid. The sample with the catalyst had gelled but did not harden, thereby implying that either that the catalyst was not incorporated into the polymer backbone or that the concentration of acrylic acid was too high for the polymer to harden.

EXAMPLE 4

The ability to incorporate acrylic acid into PDMS using a platinum-based catalyst was tested. Specifically, a mixture was made from 50 grams of Sylgard® 184 elastomer base and 5.0 grams of Sylgard® 184 curing agent. 5.0 gram portions of this mixture were then placed into ten (10) different polycarbonate Petri dishes, identified as dishes A through I. To each dish was then added 10 milliliters of a Pt(0)-1,3 divinyl-1,1, 3,3-tetramethyldisloxane complex (0.1M in xylenes) catalyst. In addition, acrylic acid was also added to the dishes B through I in amounts of 25, 50, 75, 100, 125, 150, 200, and 250 milliliters, respectively. Each dish was tightly capped to prevent the acrylic acid from evaporating.

After sitting overnight at room temperature, it was determined that the mixture in dishes A, B, C and D had cured. The mixtures in the remaining dishes had either gelled or remained liquid. Of those that had cured, the mixtures in dishes A and B could be easily removed from the Petri dish. The resulting polymer sheets were cut into strips and subjected to extraction using a Soxhlet extractor. Specifically, the strips were washed with tetrahydrfuran ("THF") for about 8 hours, ethanol for about 8 hours, and then water for about 6 hours. The strips were then freeze-dried overnight. The washed samples all darkened upon exposure to the THF, suggesting that the THF was binding to the extra catalyst present.

Contact angle measurements of the pre- and post-extraction strips were determined as follows (a lower number means that the liquid wet the surface better/that the surface was more hydrophilic):

| Pre-extraction | Post Extraction |
|---|---|
| Water | |
| 96 | 88.3 |
| 0.1 N NaOH | |
| 82.5* | 71* |

*Contact angle decreased upon standing in contact with the liquid.

Thus, not only was the acrylic acid incorporated into the resin, but also it was observed that extraction helped to render the polymer more hydrophilic. Contact angle measurements of the resin with and without acrylic acid were also determined as follows:

| With Acrylic Acid | Without (Control) |
|---|---|
| Water | |
| 91.5 | 90.3 |
| 0.1 N NaOH | |
| 72.3* | 91.3 |

*Contact angle decreased upon standing in contact with the liquid.

There was some variation in the contact angles obtained between these two sets of experiments, namely the contact angle of the 0.1 N NaOH. Given that the contact angle decreased over time, the contact angle differences were simply measured at different times after introducing the droplets to the surface. There remained a large difference between the hydrophilicity of the PDMS doped with acrylic acid and the control.

EXAMPLE 5

The ability to incorporate methacrylic acid into PDMS using a platinum-based catalyst was tested. Specifically, a mixture was made from 100 grams of Sylgard® 184 elastomer base and 10.0 grams of Sylgard® 184 curing agent. 10.0 gram portions of this mixture were then placed into ten (10) different polycarbonate Petri dishes, identified as dishes J through Q. To each dish was then added 20 milliliters of a Pt(0)-1,3 divinyl-1,1,3,3-tetramethyldisloxane complex (0.1 M in xylenes) catalyst. In addition, freshly distilled acrylic acid was added to the dishes K through M in amounts of 50, 100, and 150 milliliters, respectively. Likewise, freshly distilled methacrylic acid was added to the dishes N through Q in amounts of 50, 100, 150, and 200 milliliters, respectively. The plates were then thoroughly mixed to distribute the catalyst and dopant throughout the resin. Each Petri dish was tightly capped to prevent the acid from evaporating. The hardness of the resulting polymers was then determined and the results are set forth below in Tables 1 and 2.

TABLE 1

Type A Durometer Readings of Acrylic Acid Doped PDMS

| Sample | Hardness (Type A Durometer) |
|---|---|
| J | 55 |
| K | 43 |
| L | 24 |
| M | 5 |

TABLE 2

Type A Durometer Readings of Methacrylic Acid Doped PDMS

| Sample | Hardness (Type A Durometer) |
|---|---|
| N | 41 |
| O | 29 |
| P | 20 |
| Q | 19 |

As shown in Table 1, the hardness of the PDMS dropped off rapidly upon addition of acrylic acid. Again, this was reasonable if the acrylic acid was incorporated into the polymer backbone, thereby preventing the resin from completely crosslinking. On the other hand, as shown in Table 2, the addition of the methacrylic acid showed a slightly different trend. For instance, Samples P and Q remained clear and fairly hard. This suggested that the methacrylic acid was either better tolerated by the catalyst or that it was not incorporated into the resin. Because the hardness eventually reached a fairly constant value, the methacrylic acid appears to not have been incorporated.

EXAMPLE 6

The ability to incorporate methacrylic acid into PDMS using a platinum-based catalyst was tested. Specifically, a mixture was made from 40 grams of Sylgard® 184 elastomer base, 4.0 grams of Sylgard® 184 curing agent, and 80 milliliters of a Pt(0)-1,3 divinyl-1,1,3,3-tetramethyldisloxane complex (0.1 M in xylenes) catalyst. One half of the mixture was allowed to cure in a tightly covered Petri dish overnight at room temperature. To the other half of the uncured resin was added 200 milliliters of freshly distilled methacrylic acid. The acid was well mixed into the resin, and the resulting mixture was cured in a tightly covered Petri dish overnight at room temperature. Upon removal from the Petri dishes, the resulting methacrylic acid-doped polymer sheets were cut into strips. One half of the strips were subjected to extraction using a Soxhlet extractor. Specifically, the strips were washed with tetrahydrfuran ("THF") for about 8 hours, ethanol for about 8 hours, and then water for about 6 hours. The strips were then freeze-dried overnight. The washed samples all darkened upon exposure to the THF, suggesting that the THF was binding to the extra catalyst present.

Contact angle measurements of the pre- and post-extraction strips were determined as follows:

| Pre-extraction | Post Extraction |
|---|---|
| Water | |
| 100.8 | 112.5 |
| 0.1 N NaOH | |
| 102.1* | 100.2 |

*Contact angle decreased upon standing in contact with the liquid.

As indicated, extraction did not appear to have a major impact on the wettability of the methacrylic acid doped resin. Contact angle measurements of the resin with and without methacrylic acid were also determined as follows:

| | Without (Control) |
|---|---|
| Water | |
| With Methacrylic Acid | |
| 112.5 | 101.6 |
| 0.1 N NaOH | |
| With Methacrylic Acid* | |
| 100.2 | 101.1 |

*Post-extraction.

The difference between contact angles of all three samples was small. This suggested that the methyl group of the acid inhibited incorporation into the polymer.

EXAMPLE 7

The ability to form a patterned elastomeric material in accordance with the present invention was demonstrated. Initially, an etched wafer was cleaned by suspending it in boiling heptane vapors, followed by boiling ethanol vapors. The cleaned wafer was then placed into a polycarbonate Petri dish. A reaction mixture containing 40.0 grams of Sylgard® 184 elastomer base, 4.0 grams of Sylgard® 184 curing, 200 milliliters of distilled acrylic acid, and 80 milliliters of a Pt(0)-1,3 divinyl-1,1,3,3-tetramethyldisloxane complex (0.1 M in xylenes) catalyst was placed on the wafer. The dish was covered and the resin was allowed to cure. Upon curing, it was determined that the resin had seeped under the wafer, forming a thin film on its bottom surface that made it difficult to remove.

EXAMPLE 8

The ability to form a patterned elastomeric material in accordance with the present invention was demonstrated. Initially, an etched wafer was cleaned by suspending it in boiling heptane vapors, followed by boiling ethanol vapors. The cleaned wafer was then placed into a polycarbonate Petri dish. The surface of the wafer was then passivated by placing it in a vacuum oven with a bottle of neat $(C_6F_{13}-CH_2CH_2)_3-Si-Cl$ that was open to the oven atmosphere via a 20 gauge needle through a septum. The wafer and the perfluorinating agent were allowed to sit overnight at room temperature and under vacuum (approximately 20 inches of mercury). A reaction mixture containing 40.0 grams of Sylgard® 184 elastomer base, 4.0 grams of Sylgard® 184 curing, 200 milliliters of distilled acrylic acid, and 80 milliliters of a Pt(0)-1,3 divinyl-1,1,3,3-tetramethyidisloxane complex (0.1 M in xylenes) catalyst was placed on the wafer. The dish was covered and the resin was allowed to cure. Upon curing, it was determined that the resin was easily removed from both sides of the wafer.

EXAMPLE 9

The ability to form a patterned elastomeric material in accordance with the present invention was demonstrated. Initially, an etched wafer was cleaned by suspending it in boiling heptane vapors, followed by boiling ethanol vapors. The cleaned wafer was then placed into a polycarbonate Petri dish. The surface of the wafer was then passivated by placing it in a vacuum oven with a bottle of neat $(C_6F_{13}-CH_2CH_2)_3-Si-Cl$ that was open to the oven atmosphere via a 20 gauge needle through a septum. The wafer and the perfluorinating agent were allowed to sit overnight at room temperature and under vacuum (approximately 20 inches of mercury). A reaction mixture containing 100.0 grams of Sylgard® 184 elastomer base, 10.0 grams of Sylgard® 184 curing, 500 milliliters of distilled acrylic acid, and 200 milliliters of a Pt(0)-1,3 divinyl-1,1,3,3-tetramethyldisloxane complex (0.1 M in xylenes) catalyst was placed on the wafer. The dish was covered and the resin was allowed to cure. Bubbles appeared in the resin above the etched regions of the wafer. As a result, only a central area could be used as a stamp.

EXAMPLE 10

The ability to form a patterned elastomeric material in accordance with the present invention was demonstrated. Initially, an etched wafer was cleaned by suspending it in a solution that was heated to 90° C. and contained 30 vol. % hydrogen peroxide and 70 vol. % concentrated sulfuric acid. The treated wafer was then dried under vacuum at 200° C. The cleaned wafer was then placed into a polycarbonate Petri dish. The surface of the wafer was then passivated by placing it in a vacuum oven with a bottle of neat $(C_6F_{13}-CH_2CH_2)_3-Si-Cl$ that was open to the oven atmosphere via a 20 gauge needle through a septum. The wafer and the perfluorinating agent were allowed to sit overnight at room temperature and under vacuum (approximately 20 inches of mercury). A reaction mixture containing 100.0 grams of Sylgard 184® elastomer base, 10.0 grams of Sylgard 184® curing, 500 milliliters of distilled acrylic acid, and 200 milliliters of a Pt(0)-1,3 divinyl-1,1,3,3-tetramethyldisloxane complex (0.1 M in xylenes) catalyst Was placed on the wafer. The dish was covered and the resin was allowed to cure. Bubbles were again generated as described in Example 9. Apparently, this related to the crystal lattice of the wafer exposed by etching and may be eliminated through the use of a vacuum. In such cases, methacrylic acid (boiling point of approximately 160° C.) may be employed as the dopant due to is lower volatility than acrylic acid.

While the invention has been described in detail with respect to the specific embodiments thereof, it will be appreciated that those skilled in the art, upon attaining an understanding of the foregoing, may readily conceive of alterations to, variations of, and equivalents to these embodiments. Accordingly, the scope of the present invention should be assessed as that of the appended claims and any equivalents thereto.

What is claimed is:

1. A photolithographically-produced master comprising an elastomer applied to a support, wherein the elastomer has hydrophilic properties and comprises a crosslinked organopolysiloxane backbone copolymer formed from a silicone composition, the silicone composition comprising an organopolysiloxane component and acrylic acid, wherein the acrylic acid is incorporated into the crosslinked organopolysiloxane backbone copolymer to form the crosslinked copolymer, wherein the silicone composition has been subjected to an extraction process after crosslinking.

2. The photolithographically-produced master of claim 1, wherein the organopolysiloxane component comprises an organopolysiloxane having the following general formula:

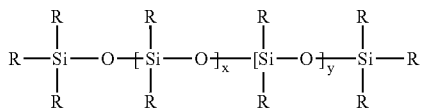

wherein,
x≧0;
y≧1; and
each R is individually selected from the group consisting of unsubstituted and substituted monovalent hydrocarbon groups containing from 1 to 20 carbon atoms.

3. The photolithographically-produced master of claim 2, wherein the organopolysiloxane contains two or more alkenyl groups.

4. The photolithographically-produced master of claim 3, wherein the organopolysiloxane has the following general formula:

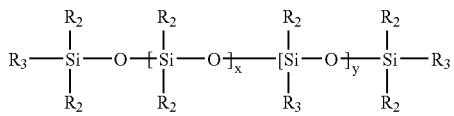

wherein,
each $R_2$ is individually selected from unsubstituted and substituted monovalent hydrocarbon groups containing from 1 to 20 carbon atoms;
each $R_3$ is individually selected from unsubstituted and substituted alkenyl groups containing from 1 to 20 carbon atoms;
x≧1; and
y≧0 and is selected so that the organopolysiloxane contains an average of at least two alkenyl groups per molecule.

5. The photolithographically-produced master of claim 4, wherein the organopolysiloxane has the following general formula:

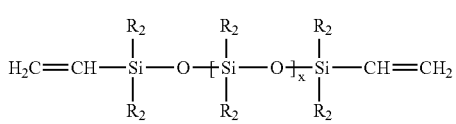

wherein,
each $R_2$ is individually selected from unsubstituted and substituted monovalent hydrocarbon groups containing from 1 to 20 carbon atoms; and
x is from 100 to 1200.

6. The photolithographically-produced master of claim 1, wherein the organopolysiloxane component comprises from about 50 weight % of the silicone composition.

7. The photolithographically-produced master of claim 1, wherein the acrylic acid comprises from about 0.5 to about 10 weight % of the silicone composition.

8. The photolithographically-produced master of claim 1, wherein the acrylic acid comprises from about 2 to about 6 weight % of the silicone composition.

9. The photolithographically-produced master of claim 1, wherein the silicone composition further comprises a crosslinking agent.

10. The photolithographically-produced master of claim 9, wherein the crosslinking agent is a silicon hydride capable of undergoing a hydrosilation reaction with the organopolysiloxane component.

11. The photolithographically-produced master of claim 10, wherein the silicone hydride crosslinking agent has the following general formula:

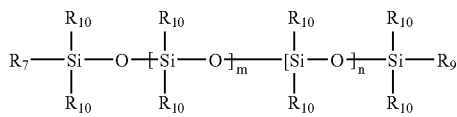

wherein,
$R_7$, $R_8$ and $R_9$ are each independently selected from unsubstituted and substituted monovalent hydrocarbon groups containing from 1 to 20 carbon atoms, wherein at least two of $R_7$, $R_8$ and $R_9$ are hydrogen;
each $R_{10}$ is independently selected from unsubstituted and substituted monovalent hydrocarbon groups containing from 1 to 20 carbon atoms;
m is an integer from 10 to 1,000; and
n is an integer from 1 to 20.

12. The photolithographically-produced master of claim 10, wherein the silicone composition further comprises a hydrosilation catalyst.

13. The photolithographically-produced master of claim 12, wherein the catalyst contains a Group VIII transition metal.

14. The photolithographically-produced master of claim 13, wherein the transition metal is platinum.

15. The photolithographically-produced master of claim 14, wherein the catalyst is a platinum-vinylsiloxane complex.

16. The photolithoprapphically-produced master of claim 15, wherein the catalyst is Pt(0)-1,3-divinyl-1,1,3,3-tetramethyldisiloxane.

17. The photolithographically-produced master of claim 12, wherein the catalyst is dispersed in an organic solvent selected from the group consisting of aliphatic hydrocarbons, aromatic hydrocarbons, halogenated hydrocarbons, and ethers.

18. The elastomer of claim 1, wherein photolithographically-produced master forms a microcontact printing stamp.

19. A photolithographically-produced master comprising an elastomer applied to a support, wherein the elastomer is formed by curing a silicone composition to form an crosslinked organopolysiloxane backbone copolymer, wherein the silicone composition has been subjected to an extraction process after being cured, the crosslinked organopolysiloxane backbone copolymer comprising:

i) an organopolysiloxane component that comprises an organopolysiloxane having the following general formula:

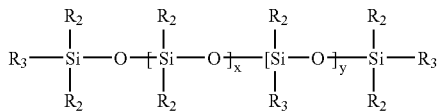

wherein,
each $R_2$ is individually selected from unsubstituted and substituted monovalent hydrocarbon groups containing from 1 to 20 carbon atoms;
each $R_3$ is individually selected from unsubstituted and substituted alkenyl groups containing from 1 to 20 carbon atoms;
$x \geq 1$; and
$y \geq 0$ and is selected so that the organopolysiloxane contains an average of at least two alkenyl groups per molecule;
ii) acrylic acid that is incorporated into the crosslinked organopolysiloxane backbone copolymer;
iii) a silicon hydride crosslinking agent; and
iv) a platinum-based catalyst.

20. The photolithographically-produced master of claim 19, wherein the organopolysiloxane has the following general formula:

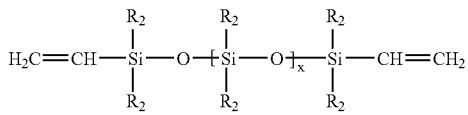

wherein,
each $R_2$ is individually selected from unsubstituted and substituted monovalent hydrocarbon groups containing from 1 to 20 carbon atoms; and
x is from 100 to 1200.

21. The photolithographically-produced master of claim 19, wherein the organopolysiloxane component comprises from about 20 wt.% to about 50 weight % of the silicone composition.

22. The photolithographically-produced master of claim 19, wherein the acrylic acid comprises from about 0.5 to about 10 weight % of the silicone composition.

23. The photolithographically-produced master of claim 19, wherein the acrylic acid comprises from about 2 to about 6 weight % of the silicone composition.

24. The photolithographically-produced master of claim 19, wherein the silicone hydride crosslinking agent has the following general formula:

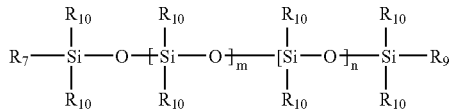

wherein,
$R_7$, $R_8$ and $R_9$ are each independently selected from unsubstituted and substituted monovalent hydrocarbon groups containing from 1 to 20 carbon atoms, wherein at least two of R7, R8 and R9 are hydrogen;
each R10 is independently selected from unsubstituted and substituted monovalent hydrocarbon groups containing from 1 to 20 carbon atoms;
m is an integer from 10 to 1,000; and
n is an integer from 1 to 20.

25. The photolithographically-produced master of claim 19, wherein the catalyst is a platinum-vinylsiloxane complex.

26. The photolithographically-produced master of claim 25, wherein the catalyst is Pt(0)-1,3-divinyl-1,1,3,3-tetramethyldiloxane.

27. The photolithographically-produced master of claim 19, wherein the catalyst is dispersed in an organic solvent selected from the group consisting of aliphatic hydrocarbons, aromatic hydrocarbons, halogenated hydrocarbons, and ethers.

28. The photolithographically-produced master of claim 19, wherein curing occurs at a temperature of from about 20° C. to about 30° C.

29. The photolithographically-produced master of claim 19, wherein the support consists of a silicon wafer, glass, or polymeric material.

30. The photolithographically-produced master of claim 19, wherein the elastomer is casted onto a master to form a microcontact printing stamp.

31. The mircrocontact printing stamp of claim 30, wherein the stamp is used to print biological molecules onto a surface for use in a biosensor.

32. The biosensor of claim 31, wherein the biosensor is used in optical sensing devices.

\* \* \* \* \*

UNITED STATES PATENT AND TRADEMARK OFFICE
CERTIFICATE OF CORRECTION

PATENT NO. : 7,452,957 B2
APPLICATION NO. : 11/217093
DATED : November 18, 2008
INVENTOR(S) : Curtis Sayre It is certified that error appears in the above-identified patent and that said Letters Patent is hereby corrected as shown below:

Column 19, Line 66 "...organopolysiloxane component comprises from about 50 weight %..." should read --...organopolysiloxane component comprises from about 20 weight % to about 50 weight %...--

Column 20, Line 17 "...general formula: should read

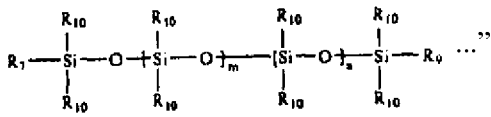

--...general formula:

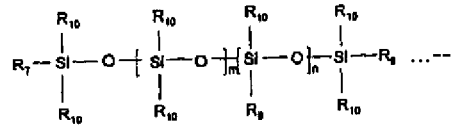

Column 22, Line 3 "...general formula: should read

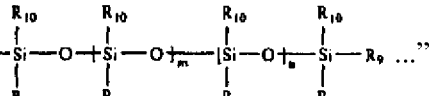

--general formula:

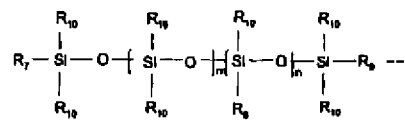

Signed and Sealed this

Thirty-first Day of March, 2009

JOHN DOLL
*Acting Director of the United States Patent and Trademark Office*